United States Patent
McCollum

(10) Patent No.: US 6,570,805 B2
(45) Date of Patent: May 27, 2003

(54) ANTIFUSE MEMORY CELL AND ANTIFUSE MEMORY CELL ARRAY

(75) Inventor: John McCollum, Saratoga, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/742,550

(22) Filed: Dec. 20, 2000

(65) Prior Publication Data

US 2002/0075744 A1 Jun. 20, 2002

(51) Int. Cl.[7] .............................. G11C 7/00; G11C 17/00
(52) U.S. Cl. ...................... 365/225.7; 365/96; 257/530; 327/525
(58) Field of Search ............................ 326/37, 38, 21; 327/525; 257/530; 365/225.7, 96

(56) References Cited

U.S. PATENT DOCUMENTS

| | | | | |
|---|---|---|---|---|
| 5,194,759 A | * | 3/1993 | El-Ayat et al. | 327/525 |
| 5,299,152 A | * | 3/1994 | Ishihara et al. | 257/530 |
| 5,327,024 A | * | 7/1994 | Cox | 326/38 |
| 6,333,666 B2 | * | 12/2001 | Kim et al. | 327/525 |

* cited by examiner

*Primary Examiner*—Son Mai
(74) *Attorney, Agent, or Firm*—Sierra Patent Group, Ltd.

(57) ABSTRACT

An antifuse memory cell comprises a first antifuse having a first electrode and a second electrode, a second antifuse having a first electrode and a second electrode, and an MOS transistor having a gate, a source and a drain, wherein the first electrode of the first antifuse is connected to the first electrode of the second antifuse, and the drain of the MOS transistor is connected to said first electrode of the first antifuse and the first electrode of the second antifuse.

4 Claims, 3 Drawing Sheets

ANTIFUSE MEMORY CELL AND ANTIFUSE MEMORY CELL ARRAY

BACKGROUND OF THE INVENTION

1. Field of the Invention

The present invention relates to memory cells. More particularly, the present invention relates to an integrated circuit memory cell structure that employs antifuses to implement an antifuse memory cell (AMC) and an array of AMCs.

2. The Background Art

There are a variety of programmable integrated circuit memory cells and arrays of these programmable integrated circuit memory cells known to those of ordinary skill in the art. Different memory types include dynamic random access memory (DRAM), static random access memory (SRAM), programmable read only memory (PROM), electrically programmable read only memory (EPROM), electrically erasable programmable read only memory (EEPROM), and Flash memory. Each of these known memory cell technologies have at least one of the following advantageous characteristics: non-volatility; high density; low power; one transistor per cell; in-system rewritability; full bit alterability; and a high performance read.

In field programmable gate array (FPGA), the logic elements in the gate array are connected together by routing resources to form a desired integrated circuit. The routing resources are connected to each other and to the logic elements in the gate array by programmable elements. In a reprogrammable FPGA, the programmable elements are typically passgates controlled by information stored in a configuration memory that is often implemented by SRAM or in some implementations by Flash memory. In a one time programmable FPGA, the programmable elements are typically antifuses that represent an open state until programmed. Both antifuse based programmable architectures and SRAM based reprogrammable architectures are well known in the FPGA art.

The programming of SRAM and Flash based configuration memories in an FPGA can be performed in parallel. In contrast, the programming of an antifuse based FPGA is performed in a serial manner. As a result, the programming time for an antifuse based FPGA can be longer than the programming time for an SRAM or Flash based FPGA. Further, current sneak paths which occur during the programming of an anti fuse based FPGA because there is typically no isolation between the antifuses in an antifuse based FPGA do not occur when SRAM or Flash based configuration memories are employed.

In comparison to an antifuse based FPGA, one important drawback to an SRAM based FPGA is the significant integrated circuit area required by each SRAM cell. Although a Flash based configuration memory does not require as much integrated circuit area as an SRAM based configuration memory, a Flash based configuration memory requires a custom integrated circuit process that is both expensive to implement and to test rather that a standard CMOS process.

In FIG. 1, a PROM that includes N-channel MOS transistors 2, bitlines 4, and employs antifuses 6 as the programmable elements in the memory is illustrated. In the PROM, the antifuses 6 in a row can be programmed by turning on the N-channel MOS transistors 2 in the row and simultaneously applying a programming voltage to the bitline 4 of the corresponding antifuse 6 that is being programmed. The PROM is employed as a memory device by turning on the N-channel MOS transistors 2 in a row and reading out on a bitline 4 through a sensing device whether the corresponding antifuse 6 has been programmed.

Unlike SRAM or Flash, the PROM of FIG. 1 is not suitable to be employed as a configuration memory for an FPGA because the PROM does not store a static voltage like the flip-flop of an SRAM memory cell or the floating gate of a Flash memory cell.

BRIEF DESCRIPTION OF THE INVENTION

According to the present invention, an antifuse memory cell includes an n-channel MOS transistor and first and second antifuses. A common node is formed by first electrodes of antifuses and the drain of the n-channel MOS transistor. Second electrodes of antifuses are connected to programming and bias circuitry. The contents of the memory cell are determined by programming either the first or second antifuse. To program either antifuse, Vpp is applied to the second electrode of the antifuse that is being programmed, Vpp/2 is applied to the second electrode of the antifuse that is not being programmed, and the common node is placed at ground potential.

According to another aspect of the present invention, when the antifuses have lower electrodes that are formed in the substrate, the required programming current can also be provided by a minimally sized n-channel MOS transistor.

According to another aspect of the present invention, the antifuse memory cells according to the present present invention may be formed in an array.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, an antifuse memory cell and an antifuse memory cell array are described herein. An antifuse is a device that is well known in the art. An antifuse device typically has first and second electrodes formed of a conductive material. Disposed between the first and second electrodes is a dielectric material that is ruptured by programming the antifuse during which a voltage is placed across the electrodes that is sufficient to rupture the dielectric and to flow material from at least one of the electrodes through the dielectric to form a conductive link between the electrodes. A soaking current is then passed through the conductive link to improve its reliability.

To avoid overcomplicating the disclosure and thereby obscuring the present invention, a more thorough description of antifuses and methods for programming them is not provided herein. A non-exhaustive description of antifuses and methods for programming them can be found in U.S. Pat. Nos. 5,272,101 and 4,899,205, assigned to present assignee and hereby incorporated by reference.

Figure 2:
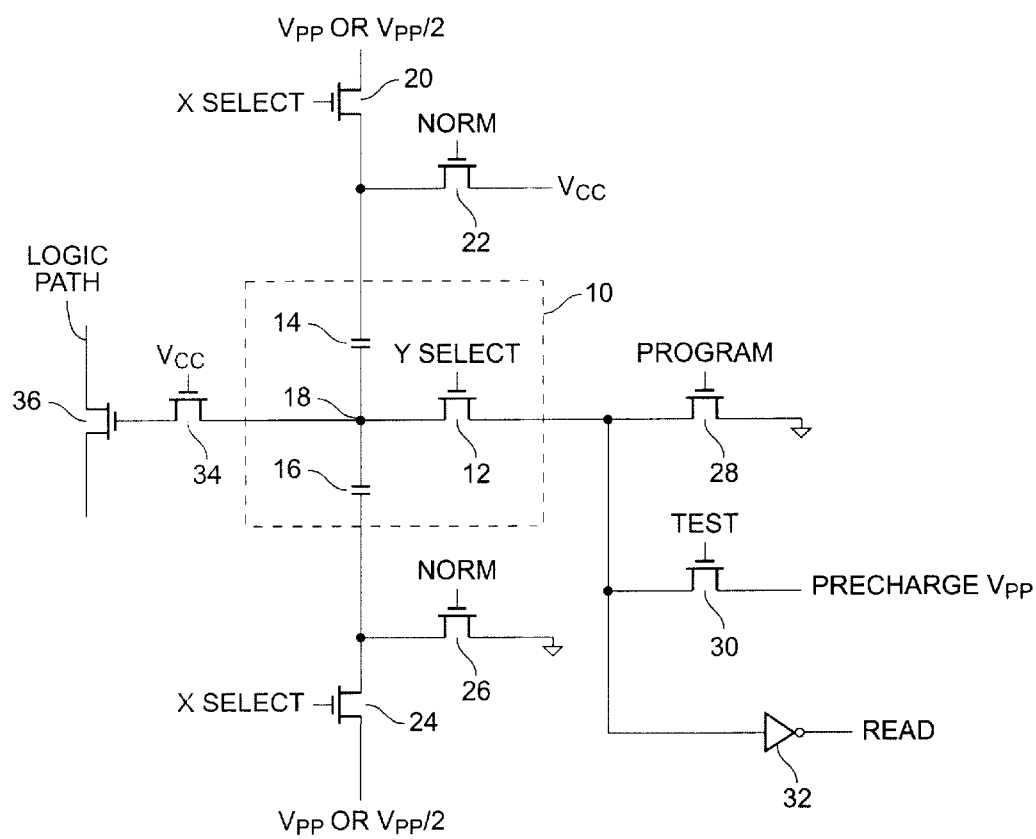
FIG. 2 is a circuit diagram of an antifuse memory cell and associated programming, bias and test circuits according to the present invention.

FIG. 2 illustrates an antifuse memory cell 10 and associated programming and logic path circuitry according to the present invention. The antifuse memory cell 10 includes an n-channel MOS transistor 12 and first and second antifuses 14 and 16, respectively. A common node 18 is formed by first electrodes of antifuses 14 and 16 and the drain of n-channel MOS transistor 12. Second electrodes of antifuses 14 and 16 are connected to programming and bias circuitry.

The second electrode of antifuse 14 is connected to the drains of n-channel MOS transistors 20 and 22, and the second electrode of antifuse 16 is connected to the drains of n-channel MOS transistors 24 and 26. The n-channel MOS transistors 20 and 22 are employed in the programming of antifuses 16 and 18, and the n-channel MOS transistors 24 and 26 are employed to bias the contents of antifuse memory cell 10 to a HIGH or LOW value. It will be appreciated by those of ordinary skill in the art that embodiments other than n-channel MOS transistor pairs 20 and 22 or 24 and 26 may be employed for programming and providing bias to the antifuse memory cell 10 according to the present invention.

The sources of n-channel MOS transistors 20 and 24 may be coupled to a programming potential Vpp or a potential Vpp/2 during a programming operation, and the gates of n-channel MOS transistors 20 and 24 are connected to an X SELECT signal. The sources of n-channel MOS transistors 22 and 26 are connected to Vcc and ground potential, respectively, and the gates of n-channel MOS transistors 20 and 24 are connected to a normal operation (NORM) signal.

The gate of n-channel MOS transistor 12 is connected to a Y SELECT signal, and the source of n-channel MOS transistor 12 is connected to the drains of n-channel MOS transistors 28 and 30 and the input of inverter 32. The gate and source of n-channel MOS transistor 28 are connected to a PROGRAM signal and ground potential, respectively, and the gate and source of n-channel MOS transistor 30 are connected to a TEST signal and a precharge Vpp potential, respectively. The output of inverter 32 forms a READ signal.

Also connected to the common node 18 is the source of an n-channel MOS transistor 34. The gate of n-channel MOS transistor 34 is connected to Vcc, and the drain of n-channel MOS transistor 14 is connected to the gate of an n-channel MOS transistor 36. A source and a drain of n-channel MOS transistor 36 are serially connected to a logic path in an FPGA in a manner that is well understood by those of ordinary skill in the art.

In antifuse memory cell 10, the contents of the memory cell 10 are determined by programming either antifuse 14 or 16. To program either antifuse 14 or 16, Vpp is applied to the second electrode of the antifuse 14 or 16 that is being programmed, Vpp/2 is applied to the second electrode of the antifuse 14 or 16 that is not being programmed, and node 18 is placed at ground potential. To apply the potentials Vpp and Vpp/2 to the second electrodes of the antifuses 14 or 16 that are to be programmed and not programmed, respectively, a high X SELECT signal is applied to the gates of n-channel MOS transistors 20 and 24 to turn on n-channel MOS transistors 20 and 24.

Further, a high Y SELECT signal and a high PROGRAM signal are applied to the gates of n-channel MOS transistors 12 and 28 to turn on n-channel MOS transistors 12 and 28 and thereby place a ground potential at node 18 formed by the first electrodes of antifuses 14 and 16. In this manner, a potential of Vpp is placed across the first and second electrodes of the selected antifuse 16 or 18 to rupture the dielectric, and a potential of Vpp/2 is placed across the first and second electrodes of the non-selected antifuse 16 or 18 to prevent a rupture of the dielectric.

For example, to program antifuse 16, Vpp is applied to the drain of n-channel MOS transistor 20, Vpp/2 is applied to the drain of n-channel MOS transistor 24, a high X SELECT signal is applied to the gates of n-channel MOS transistors 20 and 24, a high Y SELECT signal is applied to the gate of n-channel MOS transistor 12, and a high PROGRAM signal is applied to the gate of n-channel MOS transistor 28.

Once the antifuse memory cell 10 has been programmed, the contents of the antifuse memory cell 10 at node 18 are supplied by either n-channel MOS transistor 22 or 26 during normal operation by a high NORM signal applied to the gates of n-channel MOS transistors 22 and 26. Depending on which of the antifuses 14 or 16 is in a programmed state, Vcc or ground potential will be supplied to node 18 by n-channel MOS transistor 22 or 26, respectively. When antifuse 14 has been programmed, Vcc will be supplied to node 18 by n-channel MOS transistor 22, and when antifuse 16 has been programmed, the ground potential will be supplied to node 18 by n-channel transistor 26.

The contents of antifuse memory cell 10 can be read out as a READ signal through inverter 32 by turning on n-channel MOS transistor 12. It should be appreciated by those of ordinary skill in the art that inverter 32 generally represents a buffering or other device employed in the performance of a read operation as is well understood by those of ordinary skill in the art.

The programming of antifuse memory cell 10 may be checked by applying high Y SELECT and TEST signals to the gates of n-channel MOS transistors 12 and 30 to pass a precharge Vpp to node 18. The n-channel MOS transistors 12 and 30 are then turned off by applying low Y SELECT and TEST signals to the gates of n-channel MOS transistors 12 and 30. N-channel MOS transistor 12 is subsequently turned on, and the voltage on node 18 is read out through inverter 32.

According to the present invention, n-channel MOS transistor 34 is employed to isolate n-channel MOS transistor 36 from Vpp during programming so that n-channel MOS transistor 36 can be a low voltage device. If n-channel MOS transistor 34 is not included, n-channel MOS transistor 36 can be a low voltage device when the logic path is placed at Vcc during antifuse programming. It will be appreciated by those of ordinary skill in the art that a low-voltage device typically switches faster than a high voltage device.

Further, by employing an n-channel MOS transistor 34 with a low threshold voltage, Vt34, when the logic path makes a transition from LOW to HIGH, the gate of n-channel MOS transistor 36 which is at Vcc−Vt34 will be capacitively coupled or bootstrapped above Vcc. The gate of n-channel MOS transistor will float above Vcc because n-channel MOS transistor 34 will be turned off. It should be appreciated that if n-channel MOS transistor 34 is absent, the bootstrapped voltage at the gate of n-channel MOS transistor 36 will leak away.

Figure 3:
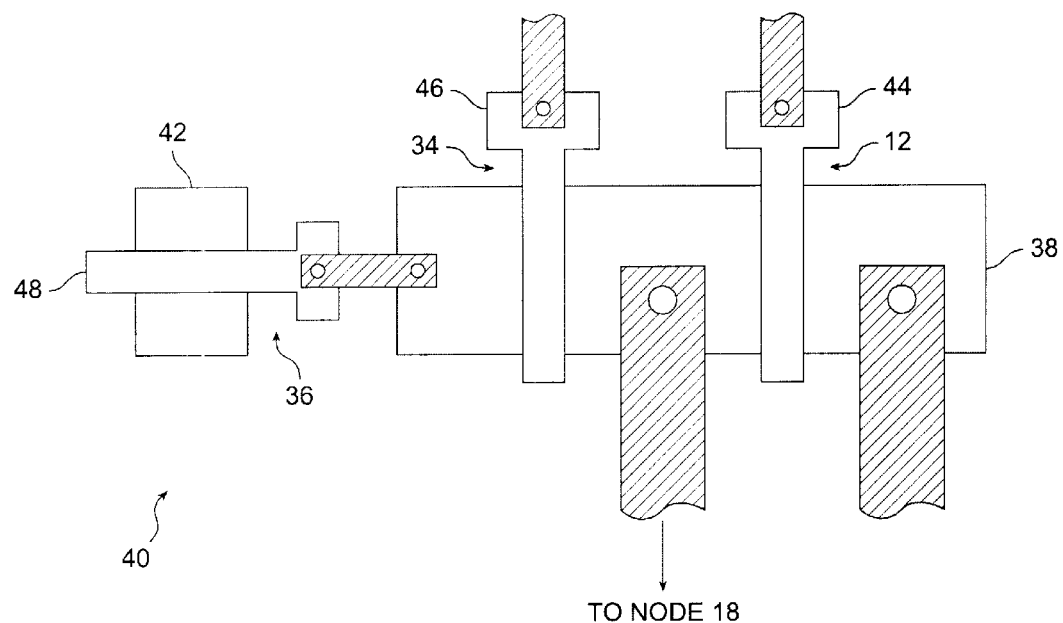
FIG. 3 illustrates a layout of portions of the circuit diagram of FIG. 2 according to the present invention.

In FIG. 3, portions of the layout of the circuit diagram of FIG. 2 formed according to standard CMOS processing techniques are illustrated. These portions include the n-channel MOS transistor 36 being controlled by the antifuse memory cell 10, the n-channel MOS transistor 34 isolating the n-channel MOS transistor 36 from the memory cell 10, and the n-channel MOS transistor 12 of the antifuse memory cell 10 employed in programming the memory cell 10.

In FIG. 3, n doped region 38 in a p type substrate 40 forms the source and drain diffusions for n-channel MOS transistors 12 and 34, and n doped region 42 forms the source and drain diffusion for n-channel MOS transistor. Polysilicon portions 44, 46, and 48 form the gates of n-channel MOS transistors 12, 34 and 36.

In a typical operation, the antifuse memory cell 10 may be employed to control the gate of an MOS transistor, as depicted by n-channel MOS transistor 36. In this circumstance, the amount of current passing through the programmed antifuse 14 or 16 is only the junction leakage current of n-channel MOS transistor 36. Accordingly, the maximum amount of current required by the antifuse memory cell 10 is during the soaking cycle of the programming operation. Typically, the required amount of current is approximately 5 mA or less. According to the present invention, the required programming current can be provided by a minimally sized n-channel MOS transistor 12 that is put into breakdown voltage impact ionization (BVii).

Figure 4:
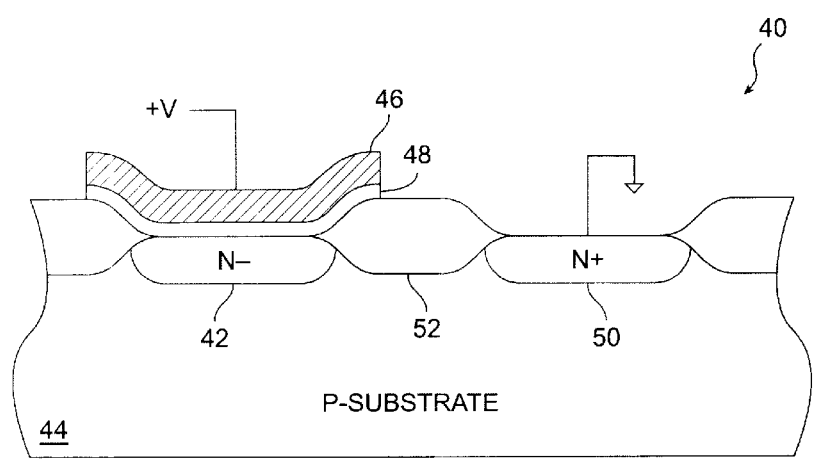
FIG. 4 is a cross-sectional view of a substrate based antifuse suitable for use according to the present invention.

When antifuses 14 and 16 have lower electrodes that are formed in the substrate, the required programming current can also be provided by a minimally sized n-channel MOS transistor 12 as described with respect to FIG. 4. In FIG. 4, an antifuse 40 is illustrated having a lower electrode 42 formed by a lightly doped N+ region in a P type substrate 44, an upper electrode 46 of polysilicon, and an antifuse material layer 48 of oxide/nitride/oxide (ONO) disposed between the lower and upper electrodes 42 and 46, respectively.

When the antifuse 40 is programmed with a positive voltage on the upper electrode 44, an avalanche of electrons and holes are generated. This is due to the extremely high temperatures that occur locally when the dielectric 48 ruptures. The electrons that are generated are drawn to the positive bias on the upper electrode 44. The holes that are generated are drawn to the lightly doped N− regions forming the lower electrode 42. Since the probability of a hole recombining with an electron in a shallow lightly doped N− region is very low, the holes will pass through to the P substrate 44.

The surge of holes into the P substrate 44 will cause a momentary rise in the substrate voltage above ground potential. Typically, the rise in the substrate voltage would rapidly discharge as the hot spot in the dielectric-silicon substrate interface rapidly cools down, because sustaining the temperature at the hotspot requires approximately at least 4.5 mA. This amount of current is not easily supplied due to the resistance of approximately 1000 ohms of the N− region forming the lower electrode 42.

However, with a grounded N+ region 50 nearby (shown separated by a field oxide region 52), such as may be provided by the drain region of n-channel MOS transistor 12 when n-channel MOS transistor 12 is turned on, the positive surge in the P substrate 44 will cause the junction of the N+ region 50 and the P substrate 44 to forward bias and inject electrons into the N− region forming the lower electrode 42. The forward junction bias will sustain the current in excess of the required approximately 4.5 mA as long as the programming voltage is supplied to the upper electrode 46. Accordingly, the required programming current can be sunk to ground potential through the P substrate 44 with a minimum geometry n-channel MOS transistor 12.

Figure 5:
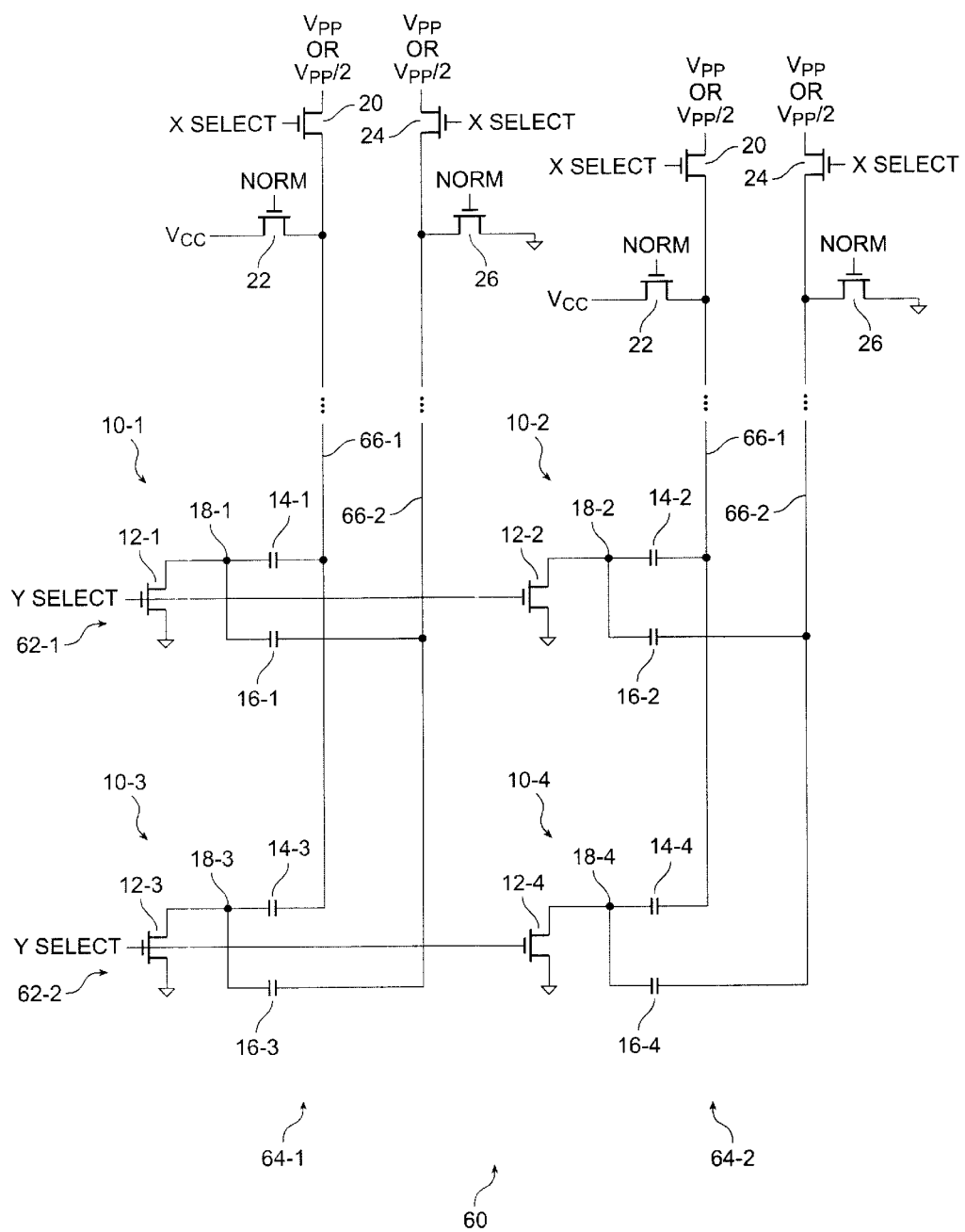
FIG. 5 is an array of antifuse memory cells in a memory array according to the present invention.

FIG. 5 illustrates an array 60 of antifuse memory cells 10-1 through 10-4 according to the present present invention. In array 60, first and second rows 62-1 and 62-2 and first and second columns 64-1 and 64-2 of antifuse memory cells 10 are illustrated. Row 62-1 includes antifuse memory cells 10-1 and 10-2, and row 62-2 includes antifuse memory cells 10-3 and 10-4. Column 64-1 includes antifuse memory cells 10-1 and 10-3, and column 64-2 includes antifuse memory cells 10-2 and 10-4.

Figure 1:
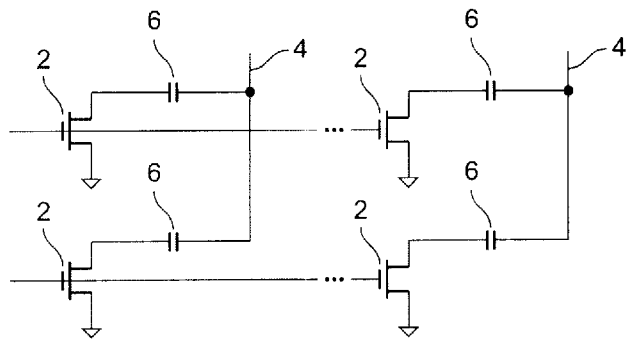
FIG. 1 illustrates an antifuse based programmable read only memory (PROM) according to the prior art.

In the array 60, each of the bitlines 66-1 and 66-2 in each column 64 are coupled to an n-channel MOS transistor pair 20 and 22 or 24 and 26 in a manner described with a respect for FIG. 1 for programming of the antifuses 14 and 16 and for normal operation of the antifuse memory cell 10. In the array 60, the sources of the n-channel MOS transistors 12, to whose gates the Y SELECT signal is applied in a row-by-row manner, are connected to ground instead of to the sources of the n-channel MOS transistors 28 and 30 and the input of inverter 32 as depicted in FIG. 2. It should be appreciated that the n-channel MOS transistors 28 and 30 and inverter 32 of FIG. 2 could be included in each row 62 or for each antifuse memory cell 10 if desired.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. The programmable circuit structure comprising;
   a first circuit node and a second circuit node programmably coupled by a pass transistor having a control gate; and
   an antifuse memory cell coupled to said control gate wherein said antifuse memory cell comprises:

a first antifuse having a first electrode coupled to said control gate through an output node and a second electrode coupled to a pull-up voltage source;

a second antifuse having a first electrode coupled to said control gate through said output node and a second electrode coupled to a pull-down voltage source.

2. The antifuse memory cell of claim 1 wherein said second electrode of said first antifuse is coupled to said pull-up voltage source through a first switch transistor, said second electrode of said second antifuse is coupled to said pull-down voltage source through a second switch transistor and said first and second antifuses are coupled to said control gate through a pass transistor.

3. The antifuse memory cell of claim 2 further comprising:

a pair of first addressing transistors, a first one of said pair of addressing transistors coupled between a first source programming potential and said second electrode of said first antifuse, a second one of said pair of addressing transistors coupled between a second programming source potential and said second electrode of said second antifuse; and a second addressing transistor coupled between said output node and a ground potential.

4. The antifuse memory cell of claim 3 further comprising:

a programming transistor coupled between said output node and a ground potential;

a testing transistor coupled between said output node and a precharge Vpp source; and a means for reading the voltage on the output node coupled to said antifuse node.

* * * * *